US008107310B2

(12) United States Patent
Kim et al.

(10) Patent No.: US 8,107,310 B2
(45) Date of Patent: Jan. 31, 2012

(54) SEMICONDUCTOR MEMORY DEVICE AND METHOD FOR OPERATING THE SAME

(75) Inventors: Dae-Suk Kim, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 211 days.

(21) Appl. No.: 12/650,594

(22) Filed: Dec. 31, 2009

(65) Prior Publication Data

US 2011/0158024 A1 Jun. 30, 2011

(30) Foreign Application Priority Data

Dec. 29, 2009 (KR) ........................ 10-2009-0133001

(51) Int. Cl.
*G11C 7/00* (2006.01)
(52) U.S. Cl. ..................... 365/222; 365/189.09; 365/236
(58) Field of Classification Search ............. 365/189.01, 365/189.05, 189.09, 203, 222, 230.03, 230.06, 365/236
See application file for complete search history.

(56) References Cited

U.S. PATENT DOCUMENTS

| | | | | |
|---|---|---|---|---|
| 6,366,515 B2 * | 4/2002 | Hidaka | ........................ | 365/200 |
| 6,449,204 B1 * | 9/2002 | Arimoto et al. | ............... | 365/222 |
| 6,611,470 B2 * | 8/2003 | Hidaka | ........................ | 365/222 |
| 6,721,223 B2 * | 4/2004 | Matsumoto et al. | .......... | 365/222 |
| 6,925,022 B2 * | 8/2005 | Arimoto et al. | ............... | 365/222 |
| 7,848,168 B2 * | 12/2010 | Jung | ........................... | 365/222 |

FOREIGN PATENT DOCUMENTS

| | | |
|---|---|---|
| KR | 1020020072020 | 9/2002 |
| KR | 10-2004-0048553 A | 6/2004 |
| KR | 1020040048553 | 6/2004 |
| KR | 1020040093895 | 11/2004 |
| KR | 100892729 | 4/2009 |

OTHER PUBLICATIONS

Notice of Preliminary Rejection issued from Korean Intellectual Property Office on Apr. 18, 2011.
Notice of Allowance issued from Korean Intellectual Property Office on Nov. 30, 2011.

* cited by examiner

*Primary Examiner* — Gene Auduong
(74) *Attorney, Agent, or Firm* — IP & T Group LLP (57) ABSTRACT

A semiconductor memory device includes a bank having a plurality of mats, an address counting unit configured to receive an auto-refresh command consecutively applied at predetermined intervals corresponding to a number of the mats, and sequentially count an internal address in response to the auto-refresh command, and an address transferring unit configured to enable the plurality of mats in response to the auto-refresh command, and transfer the internal address to the plurality of mats at predetermined time intervals.

21 Claims, 4 Drawing Sheets

SEMICONDUCTOR MEMORY DEVICE AND METHOD FOR OPERATING THE SAME

CROSS-REFERENCE TO RELATED APPLICATION

The present application claims priority of Korean Patent Application No. 10-2009-0133001, filed on Dec. 29, 2009, which is incorporated herein by reference in its entirety.

BACKGROUND OF THE INVENTION

Exemplary embodiments of the present invention relate to a semiconductor design technology, and more particularly, to an auto-refresh operation of a semiconductor memory device.

Generally, a semiconductor memory device is required to perform a refresh operation in order to retain data stored in a memory cell. A refresh operation is an operation of reading data stored in a memory cell, amplifying the read data, and again storing data in the corresponding memory cell. Due to a memory cell structure of a semiconductor memory device configured with a capacitor, if the refresh operation is not carried out, a memory cell loses data due to a leakage current. Hence, the refresh operation must be carried out.

The refresh operation is performed by activating a word line using only a row address, and then enabling a sense amplifier. In this case, only the sense amplifier is operated without outputting data.

The refresh operation is classified into an auto-refresh operation and a self-refresh operation. The auto-refresh operation periodically receives a refresh operation during the operation of a chip, stops receiving another command, performs a refresh operation, and again receives another command. The self-refresh operation periodically performs data read and write operations, even when a chip is in an idle state, in order to prevent data loss. At this time, an internal timer is operated to determine a refresh period.

Figure 1:
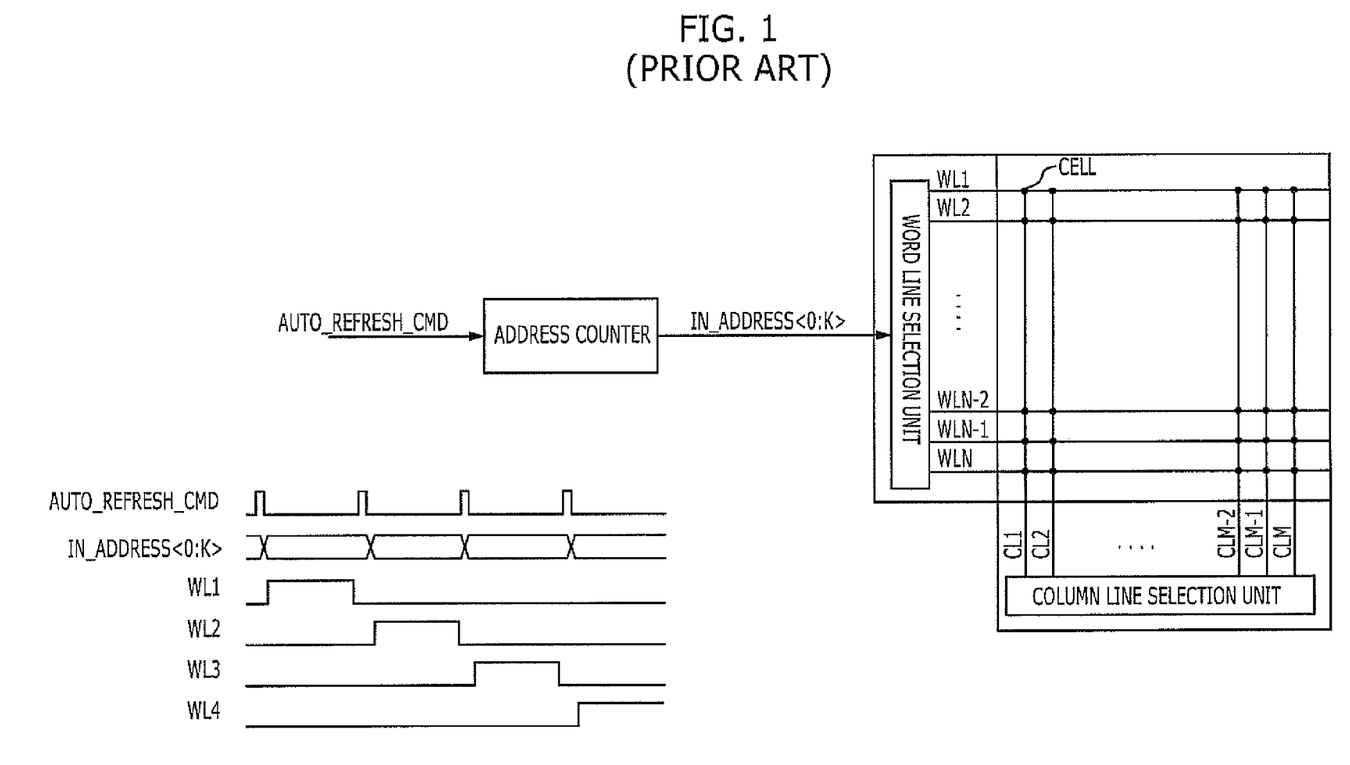
FIG. 1 is a block diagram and a timing diagram illustrating an auto-refresh operation of a conventional semiconductor memory device.

FIG. 1 is a block diagram and a timing diagram illustrating an auto-refresh operation of a conventional semiconductor memory device.

Referring to FIG. 1, whenever an auto-refresh command AUTO_REFRESH_CMD is inputted, one of N word lines included in a bank must be refreshed. In this case, the N word lines may be selected according to multi-bit internal addresses IN_ADDRESS<0:K>. Therefore, whenever the auto-refresh command AUTO_REFRESH_CMD is inputted, one of the N word lines may be selected and refreshed while changing the internal addresses IN_ADDRESS<0:K>.

That is, as can be seen from the timing diagram of FIG. 1, the operation of sequentially refreshing the N word lines is an operation of repeating N times the operation of refreshing the word lines one by one while increasing the internal addresses IN_ADDRESS<0:K> one by one according to the input of the auto-refresh command AUTO_REFRESH_CMD.

However, like in a conventional memory device, if an operation of counting the internal addresses IN_ADDRESS<0:K> is performed as many times as the number of word lines in order to refresh a plurality of word lines included in a bank, the internal addresses IN_ADDRESS<0:K> having a larger number of bits are required when a larger number of word lines are included in a bank. Furthermore, a larger amount of electric current is consumed in order to count the internal addresses IN_ADDRESS<0:K> having a large number of bits.

Moreover, as the values of the internal addresses IN_ADDRESS<0:K> are greatly changed, a larger amount of electric current is consumed in a peripheral circuit required in an operation of selecting one of the word lines included in a bank according to the value of the internal addresses IN_ADDRESS<0:K>.

SUMMARY OF THE INVENTION

Exemplary embodiments of the present invention are directed to a semiconductor memory device in which the input numbers of an auto-refresh command are less than the counting numbers of an internal address, thereby minimizing the magnitude of electric current consumed for an auto-refresh operation.

In accordance with an embodiment of the present invention, a semiconductor memory device includes a bank having a plurality of mats, an address counting unit configured to receive an auto-refresh command consecutively applied at predetermined intervals corresponding to a number of the mats, and sequentially count an internal address in response to the auto-refresh command, and an address transferring unit configured to enable the plurality of mats in response to the auto-refresh command, and transfer the internal address to the plurality of mats at predetermined time intervals.

In accordance with another embodiment of the present invention, a semiconductor memory device includes a bank having an up mat and a down mat, an address counting unit configured to receive an even or odd command of an auto-refresh command consecutively applied, and sequentially count an internal address in response to the even or odd command, and an address transferring unit configured to enable the up mat and the down mat in response to the auto-refresh command, and transfer the internal address to the up mat and the down mat at predetermined time intervals.

In accordance with yet another embodiment of the present invention, a method for operating a semiconductor memory device including a bank having a plurality of banks includes generating a counting control signal in response to an auto-refresh command inputted at predetermined intervals corresponding to a number of a plurality of mats, the auto-refresh command being consecutively inputted, sequentially counting an internal address in response to the counting control signal, enabling the plurality of mats in response to the input of the auto-refresh command, and transferring the internal address to the plurality of mats, having been enabled, at predetermined time intervals.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
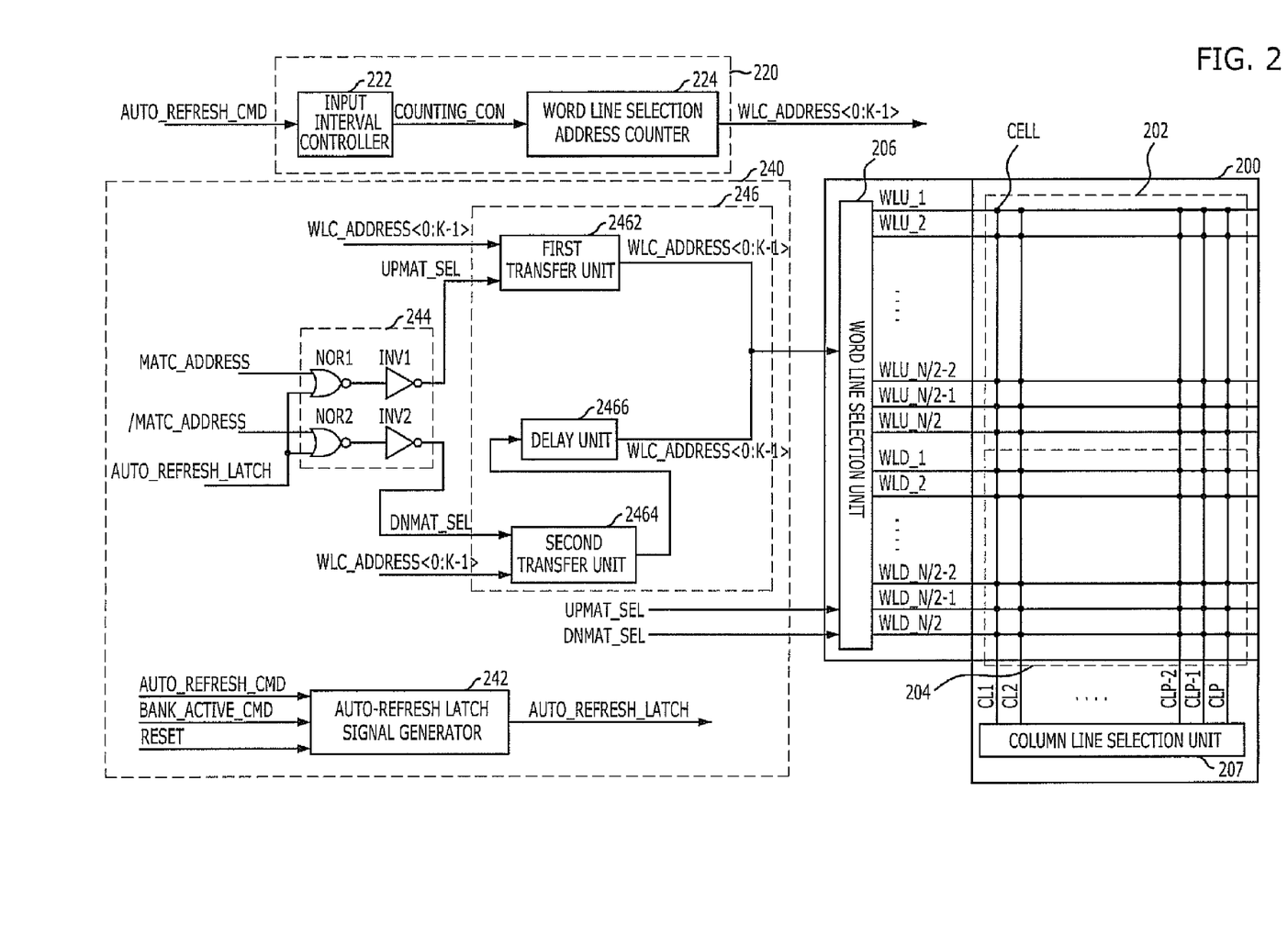
FIG. 2 is a block diagram of an auto-refresh circuit of a semiconductor memory device in accordance with an embodiment of the present invention.

FIG. 2 is a block diagram of an auto-refresh circuit of a semiconductor memory device in accordance with an embodiment of the present invention.

Referring to FIG. 2, the auto-refresh circuit of the semiconductor memory device in accordance with the embodiment of the present invention includes a bank 200, an address counting unit 220, and an address transferring unit 240. The bank 200 includes an up mat 202 and a down mat 204. The address counting unit 220 is configured to receive an even command or an odd command of an auto-refresh command AUTO_REFRESH_CMD, which is consecutively applied, and sequentially count internal addresses IN_ADDRESS<0:K> in response to the received command. The address transferring unit 240 is configured to enable the up mat 202 and a down mat 204 in response to the auto-refresh command AUTO_REFRESH_CMD, and transfer word line selection addresses WLC_ADDRESS<0:K−1> to the up mat 202 and the down mat 204 at a predetermined time interval (tDELAY).

The internal addresses IN_ADDRESS<0:K> include a mat selection address MATC_ADDRESS for selecting the up mat 202 and the down mat 204, and word line selection addresses WLC_ADDRESS<0:K−1> for selecting a plurality of word lines WLU_1, WLU_2, WLU_3 . . . WLU_N/2-3, WLU_N/2-2, WLU_N/2-1, and WLU_N/2 provided in the up mat 202 and a plurality of word lines WLD_1, WLD_2, WLD_3 . . . WLD_N/2-3, WLD_N/2-2, WLD_N/2-1, and WLD_N/2 provided in the down mat 204.

For example, the most significant bit (MSB) of the internal addresses IN_ADDRESS<0:K> (i.e., internal address IN_ADDRESS<K>) may be the mat selection address MATC_ADDRESS, and the remaining internal addresses IN_ADDRESS<0:K−1> (i.e., the internal addresses IN_ADDRESS<0:K> except for the MSB internal address IN_ADDRESS<K>) may be the word line selection addresses WLC_ADDRESS<0:K−1>.

The address counting unit 220 includes an input interval controller 222 and a word line selection address counter 224. The input interval controller 222 is configured to generate a counting control signal COUNTING_CON in response to the odd or even auto-refresh command AUTOREFRESH_CMD. The word line selection address counter 224 is configured to count the word line selection addresses WLC_ADDRESS<0:K−1> in response to the counting control signal COUNTING_CON.

Although it might seem incorrect that, as described above, the address counting unit 220 sequentially counts the internal addresses IN_ADDRESS<0:K>, because the word line selection address counter 224 provided in the address counting unit 220 counts the word line selection addresses WLC_ADDRESS<0:K−1>, this is not the case. As described above, since the internal addresses IN_ADDRESS<0:K> include the mat selection address MATC_ADDRESS and the word line selection addresses WLC_ADDRESS<0:K−1>, counting the internal addresses IN_ADDRESS<0:K> sequentially in the address counting unit 220 may be the same operation as counting the word line selection addresses WLC_ADDRESS<0:K−1>.

In this case, when counting the internal addresses IN_ADDRESS<0:K>, the counting operation is performed $2^K$ times until the counting operation is completed. When counting the word line selection addresses WLC_ADDRESS<0:K−1>, the counting operation is performed $2^{K-1}$ times until the counting operation is completed.

That is, in the semiconductor memory device in accordance with the embodiment of the present invention, the address counting unit 220 counts the internal addresses IN_ADDRESS<0:K> in the same manner as in the conventional semiconductor memory device, but the numbers of the counting operation are reduced by ½.

Since only the up mat 202 and the down mat 204 exist in the bank 200, the input interval controller 222 and the word line selection address counter 224 provided in the address counting unit 220 may operate in the following two operation modes.

In the first operation mode, the input interval controller 222 performs an operation of changing the logic level of the counting control signal COUNTING_CON in response to the input of the auto-refresh command AUTO_REFRESH_CMD.

Furthermore, in the first operation mode, the word line selection address counter 224 performs an operation of sequentially counting the word line selection addresses WLC_ADDRESS<0:K−1> at each rising edge of the counting control signal COUNTING_CON, or an operation of sequentially counting the word line selection addresses WLC_ADDRESS<0:K−1> at each falling edge of the counting control signal COUNTING_CON.

In the second operation mode, the input interval controller 222 performs an operation of counting the input of the auto-refresh command AUTO_REFRESH_CMD and changing the logic level of the counting control signal COUNTING_CON in response to a count value when the count value becomes 2.

Further, in the second operation mode, the word line selection address counter 224 performs an operation of sequentially counting the word line selection addresses WLC_ADDRESS<0:K−1> at each logic level transition (i.e., at each rising or falling edge) of the counting control signal COUNTING_CON.

The address transferring unit 240 includes an auto-refresh latch signal generator 242, a mat enable controller 244, and a transfer controller 246. The auto-refresh latch signal generator 242 is configured to generate an auto-refresh latch signal AUTO_REFRESH_LATCH which is activated in response to the auto-refresh command AUTO_REFRESH_CMD and deactivated in response to a bank active signal BANK_ACTIVE_CMD. The mat enable controller 244 is configured to activate an up mat selection signal UPMAT_SEL, which is matched with the activated state of the mat selection address MATC_ADDRESS, and to activate a down mat selection signal DNMAT_SEL, which is matched to the deactivated state of the mat selection address MATC_ADDRESS, while in an activation period of the auto-refresh latch signal AUTO_REFRESH_LATCH. The transfer controller 246 is configured to transfer the word line selection addresses WLC_ADDRESS<0:K−1> to the up mat 202 in response to the activation of the up mat selection signal UPMAT_SEL, and transfer the word line selection addresses WLC_ADDRESS<0:K−1> to the down mat 204 in response to the activation of the down mat selection signal DNMAT_SEL at a predetermined time interval (tDELAY) therebetween.

The auto-refresh latch signal generator 242 is enabled in response to the toggling of the auto-refresh command AUTO_REFRESH_CMD when the auto-refresh latch signal AUTO_REFRESH_LATCH is in a deactivated state, and is kept in an enabled state when the auto-refresh latch signal AUTO_REFRESH_LATCH is in an activated state, without regard to the toggling of the auto-refresh command AUTO_REFRESH_CMD. Further, the auto-refresh latch signal generator 242 is disabled in response to the toggling of the bank active signal BANK_ACTIVE_CMD. Moreover, all operations are initialized in response to a reset signal RESET.

In the activation period of the auto-refresh latch signal AUTO_REFRESH_LATCH, the mat enable controller 244 is configured to activate the up mat selection signal UPMAT_SEL and the down mat selection signal DNMAT_SEL, without regard to the activation and deactivation of the mat selection address MATC_ADDRESS. On the other hand, in the deactivation period of the auto-refresh latch signal AUTO_REFRESH_LATCH, the mat enable controller 244 is configured to activate the up mat selection signal UPMAT_SEL and deactivate the down mat selection signal DNMAT_SEL when the mat selection address MATC_ADDRESS is in the activated state, and to deactivate the up mat selection signal UPMAT_SEL and activate the down mat selection signal DNMAT_SEL when the mat selection address MATC_ADDRESS is in the deactivated state.

The activation of the mat selection address MATC_ADDRESS means that the value of the mat selection address MATC_ADDRESS becomes 1, and the deactivation of the mat selection address MATC_ADDRESS means that the value of the mat selection address MATC_ADDRESS becomes 0. That is, since as described above, the mat selection address MATC_ADDRESS is the MSB internal address IN_ADDRESS<K> among the internal addresses IN_ADDRESS<0:K>, the mat selection address MATC_ADDRESS is activated when the MSB internal address IN_ADDRESS<K> is 1, and the mat selection address MATC_ADDRESS is deactivated when the MSB internal address IN ADDRESS<K> is 0.

The configuration of the mat enable controller 244 will be described below in more detail. The mat enable controller 244 includes a first NOR gate NOR1, a first inverter INV1, a second NOR gate NOR2, and a second inverter INV2. The first NOR gate NOR1 is configured to receive the mat selection address MATC_ADDRESS and the auto-refresh latch signal AUTO_REFRESH_LATCH through first and second input terminals thereof. Further, together the first NOR gate NOR1 and the first inverter INV1 are configured to perform an AND operation on the received signals MATC_ADDRESS and AUTO_REFRESH_LATCH to determine the logic level of the up mat selection signal UPMAT_SEL. The second NOR gate NOR2 is configured to receive an inverted mat selection address /MATC_ADDRESS and the auto-refresh latch signal AUTO_REFRESH_LATCH through first and second input terminals thereof. Further, together the second NOR gate NOR2 and the second inverter INV2 are configured to perform an AND operation on the received signals /MATC_ADDRESS and AUTO_REFRESH_LATCH to determine the logic level of the down mat selection signal DNMAT_SEL.

The transfer controller 246 includes a first transfer unit 2462, a second transfer unit 2464, and a delay unit 2466. The first transfer unit 2462 is configured to receive the up mat selection signal UPMAT_SEL and the word line selection addresses WLC_ADDRESS<0:K−1>, and transfer the word line selection addresses WLC_ADDRESS<0:K−1> to the up mat 202. The second transfer unit 2464 is configured to receive the down mat selection signal DNMAT_SEL and the word line selection addresses WLC_ADDRESS<0:K−1>, and transfer the word line selection addresses WLC_ADDRESS<0:K−1> to the down mat 204. The delay unit 2466 is connected to an output terminal of the second transfer unit 2464 and configured to delay the word line selection addresses WLC_ADDRESS<0:K−1>, which are transferred from the second transfer unit 2464 to the down mat 204, by a predetermined time (tDELAY).

The first transfer unit 2462 is configured to transfer the word line selection addresses WLC_ADDRESS<0:K−1> to the word line selection unit 206 provided in the bank 200 in response to the activation of the up mat selection signal UPMAT_SEL. In this case, since the word line selection unit 206 provided in the bank 200 allows the word line selection addresses WLC_ADDRESS<0:K−1> to be provided from the first transfer unit 2462 to the up mat 202 in response to the activation of the up mat selection signal UPMAT_SEL, any one of the word lines WLU_1, WLU_2, WLU_3 ... WLU_N/2-3, WLU_N/2-2, WLU_N/2-1, and WLU_N/2 provided in the up mat 202 may be selected in response to the word line selection addresses WLC_ADDRESS<0:K−1>.

The second transfer unit 2464 is configured to transfer the word line selection addresses WLC_ADDRESS<0:K−1> to the word line selection unit 206 provided in the bank 200 in response to the activation of the down mat selection signal DNMAT_SEL. In this case, since the word line selection unit 206 provided in the bank 200 allows the word line selection addresses WLC_ADDRESS<0:K−1> to be provided from the second unit 2464 to the down mat 204 in response to the activation of the down mat selection signal DNMAT_SEL, any one of the word lines WLD_1, WLD_2, WLD_3 ... WLD_N/2-3, WLD_N/2-2, WLD_N/2-1, and WLD_N/2 provided in the down mat 204 may be selected in response to the word line selection addresses WLC_ADDRESS<0:K−1>.

The delay unit 2466 is connected to the output terminal of the second transfer unit 2464 and configured to delay the word line selection addresses WLC_ADDRESS<0:K−1>, which are transferred from the second transfer unit 2464 to the word line selection unit 206 of the bank 200, by the predetermined time (tDELAY).

That is, when the up mat selection signal UPMAT_SEL and the down mat selection signal DNMAT_SEL are activated, and thus, the word line selection addresses WLC_ADDRESSES<0:K−1> outputted from the first transfer unit 2462 and the second transfer unit 2464 are transferred to the up mat 202 and the down mat 204, respectively, the delay unit 2466 is operated so that the point in time when the word line selection addresses WLC_ADDRESS<0:K−1> outputted from the second transfer unit 2464 are transferred to the down mat 204 is later than the point in time when the word line selection addresses WLC_ADDRESS<0:K−1> outputted from the first transfer unit 2462 are transferred to the up mat 202 by the predetermined time (tDELAY).

As described above, due to the operation of the transfer controller 246, at the first point in time when the word line selection addresses WLC_ADDRESS<0:K−1> are inputted to the up mat 202, the up mat 202 performs the refresh operation by driving one word line corresponding to the word line selection addresses WLC_ADDRESS<0:K−1> among the plurality of word lines WLU_1, WLU_2, WLU_3 ... WLU_N/2-3, WLU_N/2-2, WLU_N/2-1, and WLU_N/2 provided in the up mat 202. At the second point in time when the word line selection addresses WLC_ADDRESS<0:K−1> are inputted to the down mat 204, wherein the second point in time is later than the first point in time by the predetermined time (tDELAY) and the refresh operation of the up mat 202 is not completed, the down mat 204 performs the refresh operation by driving one word line corresponding to the word line selection addresses WLC_ADDRESS<0:K−1> among the plurality of word lines WLD_1, WLD_2, WLD_3 ... WLD_N/2-3, WLD_N/2-2, WLD_N/2-1, and WLD_N/2 provided in the down mat 204.

The transfer controller 246 may be modified to operate in an opposite manner to the above-described operation. That is, although it has been described above that the delay unit 2466 is connected to the output terminal of the second transfer unit 2464 and connected to the word line selection unit 206, and the output terminal of the first transfer unit 2462 is connected to the word line selection unit 206, the delay unit 2466 may be connected to the output terminal of the first transfer unit 2462 and connected to the word line selection unit 206, and the output terminal of the second transfer unit 2464 may be connected to the word line selection unit 206.

In this opposite manner, the point in time when the word line selection addresses WLC_ADDRESS<0:K−1> outputted from the first transfer unit 2462 are transferred to the up mat 202 is later than the point in time when the word line selection addresses WLC_ADDRESS<0:K−1> outputted from the second transfer unit 2464 are transferred to the down mat 204 by the predetermined time (tDELAY).

Due to the such an opposite operation of the transfer controller 246, at the first point in time when the word line selection addresses WLC_ADDRESS<0:K−1> are inputted to the down mat 204, the down mat 204 performs the refresh operation by driving one word line corresponding to the word line selection addresses WLC_ADDRESS<0:K−1> among the plurality of word lines WLD_1, WLD_2, WLD_3 . . . WLD_N/2-3, WLD_N/2-2, WLD_N/2-1, and WLD_N/2 provided in the down mat 204. At the second point in time when the word line selection addresses WLC_ADDRESS<0:K−1> are inputted to the up mat 202, wherein the second point in time is later than the first point in time by the predetermined time (tDELAY) and the refresh operation of the down mat 204 is not completed, the up mat 202 performs the refresh operation by driving one word line corresponding to the word line selection addresses WLC_ADDRESS<0:K−1> among the plurality of word lines WLU_1, WLU_2, WLU_3 . . . WLU_N/2-3, WLU_N/2-2, WLU_N/2-1, and WLU_N/2 provided in the up mat 202.

Meanwhile, in the semiconductor memory device in accordance with the embodiment of the present invention, N/2 word lines WLU_1, WLU_2, WLU_3 . . . WLU_N/2-3, WLU_N/2-2, WLU_N/2-1, and WLU_N/2 are provided in the up mat 202, and N/2 word lines WLD_1, WLD_2, WLD_3 . . . WLD_N/2-3, WLD_N/2-2, WLD_N/2-1, and WLD_N/2 are provided in the down mat 204. The refresh operation is simultaneously performed on the up mat 202 and the down mat 204 at the predetermined time interval (tDELAY). Therefore, in order to refresh the total number N of the word lines WLU_1, WLU_2, WLU_3 . . . WLU_N/2-3, WLU_N/2-2, WLU_N/2-1, WLU_N/2, WLD_1, WLD_2, WLD_3 . . . WLD_N/2-3, WLD_N/2-2, WLD_N/2-1, and WLD_N/2 provided in the up mat 202 and the down mat 204, the counting of the word line selection addresses WLC_ADDRESS<0:K−1> is performed N/2 times. That is, in the embodiment of the present invention, the counting of the word line selection addresses WLC_ADDRESS<0:K−1> is performed N/2 times in order to refresh the total number N of the word lines WLU_1, WLU_2, WLU_3 . . . WLU_N/2-3, WLU_N/2-2, WLU_N/2-1, WLU_N/2, WLD_1, WLD_2, WLD_3 . . . WLD_N/2-3, WLD_N/2-2, WLD_N/2-1, and WLD_N/2 provided in the up mat 202 and the down mat 204, as opposed to the prior art in which the counting of the internal addresses IN_ADDRESS<0:K> is performed N times in order to select the total number N of the word lines WL_1, WL_2, WL_3 . . . WLN_N-3, WLN-2, WLN-1, and WLN. Hence, the counting numbers necessary to complete the auto-refresh operation in the semiconductor memory device in accordance with the embodiment of the present invention are reduced by ½ compared with those in the conventional semiconductor memory device.

The operation of the auto-refresh circuit in the semiconductor memory device in accordance with the exemplary embodiment of the present invention will be described below.

Figure 3:
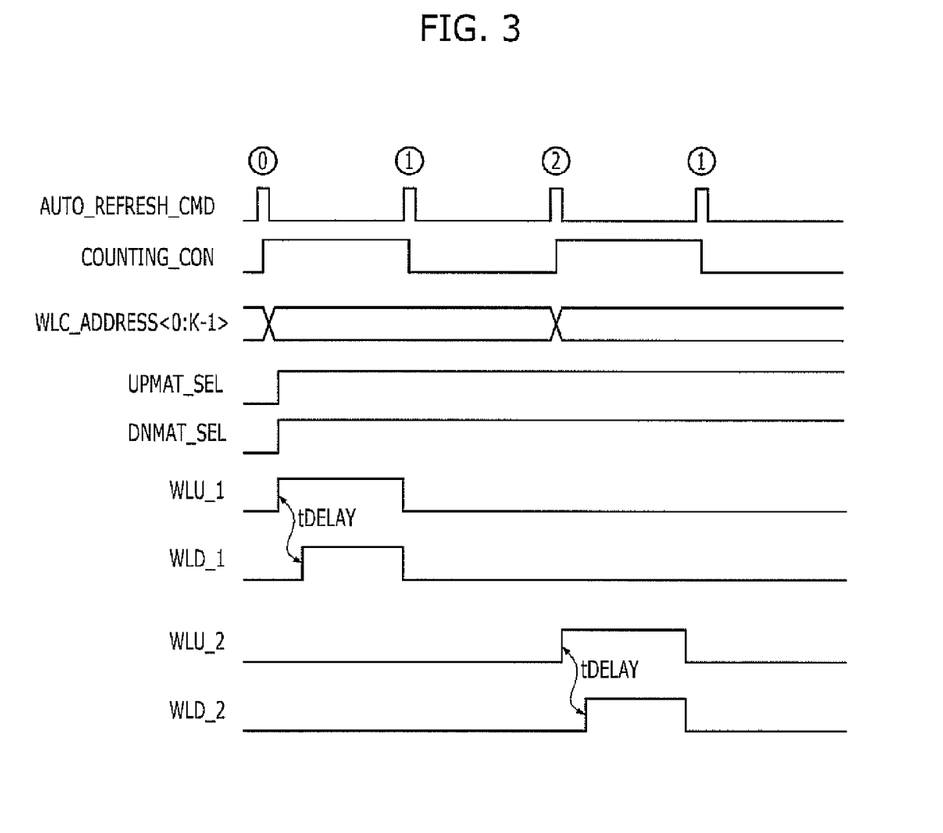
FIG. 3 is a timing diagram illustrating the auto-refresh operation of the auto-refresh circuit in the semiconductor memory device of FIG. 2.

FIG. 3 is a timing diagram illustrating the auto-refresh operation of the auto-refresh circuit in the semiconductor memory device of FIG. 2.

First, when the auto-refresh command AUTO_REFRESH_CMD is consecutively inputted, the logic level of the counting control signal COUNTING_CON is changed in response to the auto-refresh command AUTO_REFRESH_CMD. The counting control signal COUNTING_CON illustrated in FIG. 3 is a case where its logic level is changed whenever the auto-refresh command AUTO_REFRESH_CMD is applied. A count value may be obtained by counting the input numbers of the auto-refresh command AUTO_REFRESH_CMD, and the logic level of the counting control signal COUNTING_CON may be changed in response to the count value when the count value becomes 2. For example, reference numbers ① and ② represent the count values of the auto-refresh command AUTO_REFRESH_CMD, and the logic level of the counting control signal COUNTING_CON may be changed at the point in time when the count value ② is counted.

In such a manner, the word line selection addresses WLC_ADDRESS<0:K−1> are sequentially counted in response to the logic level transition of the word line selection addresses WLC_ADDRESS<0:K−1>. The word line selection addresses WLC_ADDRESS<0:K−1> illustrated in FIG. 3 are counted at the rising edges of the counting control signal COUNTING_CON. Although it is illustrated in FIG. 3 that the word line selection addresses WLC_ADDRESS<0:K−1> are counted at the rising edges of the counting control signal COUNTING_CON, the word line selection addresses WLC_ADDRESS<0:K−1> may also be counted at the falling edges of the counting control signal COUNTING_CON. Furthermore, in a case where the logic level of the counting control signal COUNTING_CON is changed, the word line selection addresses WLC_ADDRESS<0:K−1> may be counted in response to the logic level transition of the counting control signal COUNTING_CON, including the rising edges and the falling edges thereof, by counting the input of the auto-refresh command AUTO_REFRESH_CMD.

It can be seen that the up mat selection signal UPMAT_SEL and the down mat selection signal DNMAT_SEL are simultaneously activated in response to the auto-refresh command AUTO_REFRESH_CMD applied at the first time, independent of the operation of counting the word line selection addresses WLC_ADDRESS<0:K−1>. In this way, the word line selection addresses WLC_ADDRESS<0:K−1> counted in response to the counting control signal COUNTING_CON may be simultaneously transferred to the up mat 202 and the down mat 204 at the predetermined time interval (tDELAY).

That is, due to the simultaneous activation of the up mat selection signal UPMAT_SEL and the down mat selection signal DNMAT_SEL, the first word line WLU_1 among the word lines WLU_1, WLU_2, WLU_3 . . . WLU_N/2-3, WLU_N/2-2, WLU_N/2-1, and WLU_N/2 provided in the up mat 202 is driven and the refresh operation is performed thereon. After the elapse of the predetermined time (tDELAY), the first word line WLD_1 among the word lines WLD_1, WLD_2, WLD_3 . . . WLD_N/2-3, WLD_N/2-2, WLD_N/2-1, and WLD_N/2 provided in the down mat 204 is driven and the refresh operation is performed thereon.

At this time, the reason for the predetermined time interval (tDELAY) between the start time point of the section where the first word line WLU_1 provided in the up mat 202 is driven and refreshed and the start time point of the section where the first word line WLD_1 provided in the down mat 204 is driven and refreshed is to minimize the magnitude of the peak current consumed. The first section where the most amount of electric current is consumed ranges from the point in time when the first word line WLU_1 provided in the up mat 202 is driven and refreshed, to the point in time after the elapse of the predetermined time (tDELAY), and the second section where the most amount of electric current is consumed ranges from the time point when the first word line WLD_1 provided in the mat 204 is driven and refreshed, to the time point after the elapse of the predetermined time (tDELAY). Thus, the use of the predetermined time interval (tDELAY) minimizes the magnitude of the peak current consumed when performing the refresh operation by simultaneously driving the first word line WLU_1 provided in the up mat 202 and the first word line WLD_1 provided in the down mat 204.

Still referring to FIG. 3, the value of the word line selection addresses WLC_ADDRESS<0:K−1> changes at the second rising edge of the counting control signal COUNTING_CON, and the second word line WLU_2 provided in the up mat 202 is driven in response to the value of the word line selection addresses WLC_ADDRESS<0:K−1> and the refresh operation is performed thereon. After the elapse of the predetermined time (tDELAY), the second word line WLD_2 provided in the down mat 204 is driven and the refresh operation is performed thereon.

The refresh operation is completed by simultaneously performing the above-described operation N/2 times with respect to the up mat 202 and the down mat 204 using the predetermined time interval (tDELAY).

Referring to the timing diagram of FIG. 3, the refresh operation is performed by driving the word lines WLU_1, WLU_2, WLU_3 . . . WLU_N/2-3, WLU_N/2-2, WLU_N/2-1, and WLU_N/2 provided in the up mat 202, and then driving the word lines WLD_1, WLD_2, WLD_3 . . . WLD_N/2-3, WLD_N/2-2, WLD_N/2-1, and WLD_N/2 provided in the down mat 204 after the predetermined time (tDELAY). This operation is determined by the designer's choice and may be performed in the opposite manner as described above. That is, the refresh operation may be performed by driving the word lines WLD_1, WLD_2, WLD_3 . . . WLD_N/2-3, WLD_N/2-2, WLD_N/2-1, and WLD_N/2 provided in the down mat 204, and then driving the word lines WLU_1, WLU_2, WLU_3 . . . WLU_N/2-3, WLU_N/2-2, WLU_N/2-1, and WLU_N/2 provided in the up mat 202 after the predetermined time (tDELAY).

In the semiconductor memory device in accordance with the embodiment of the present invention, the auto-refresh command AUTO_REFRESH_CMD is not directly applied to the word line selection address counter 224 in order to control the counting operation thereof, but the counting operation of the word line selection counter 224 is controlled by generating the counting control signal COUNTING_CON. This is done for removing the difference in the input numbers of the auto-refresh command AUTO_REFRESH_CMD, which is caused because the auto-refresh command AUTO_REFRESH_CMD is frequently applied two times the counting control numbers required in the word line selection address counter 224 in order to count the word line selection addresses WLC_ADDRESS<0:K−1>. That is, since the input numbers and timing of the auto-refresh command AUTO_REFRESH_CMD cannot be directly controlled in the semiconductor memory device, the counting operation is controlled by additionally generating a control signal, such as the counting control signal COUNTING_CON. Therefore, if the input numbers and timing of the auto-refresh command AUTO_REFRESH_CMD can be directly controlled, the counting operation may be controlled by directly transferring the auto-refresh command AUTO_REFRESH_CMD to the word line selection address counter 224, instead of controlling the counting operation of the word line selection address counter 224 by generating the counting control signal COUNTING_CON.

In the semiconductor memory device in accordance with the embodiment of the present invention, when the auto-refresh operation is performed, two word lines (i.e., one word line of both the up mat 202 and the down mat 204 in the bank 200) may be simultaneously refreshed in response to a one-time counting operation of the word line selection addresses WLC_ADDRESS<0:K−1>. Hence, all of the word lines included in the bank 200 may be refreshed by counting the word line selection addresses WLC_ADDRESS<0:K−1> as many times as half the number of all of the word lines included in the bank 200.

Thus, the current consumption in the address counting unit 220, which counts the word line selection addresses WLC_ADDRESS<0:K−1>, is reduced by ½ because the numbers of the counting operation are reduced by ½. In addition, since the circuit operation time is reduced by ½, it is possible to reduce the current consumption in the word line selection unit 206, which selects any one of the word lines WLU_1, WLU_2, WLU_3 . . . WLU_N/2-3, WLU_N/2-2, WLU_N/2-1, WLU_N/2, WLD_1, WLD_2, WLD_3 . . . WLD_N/2-3, WLD_N/2-2, WLD_N/2-1, and WLD_N/2 provided in the bank 200 in response to the word line selection addresses WLC_ADDRESS<0:K−1>.

Moreover, when the two word lines (i.e., one word line of both the up mat 202 and the down mat 204 in the bank 200) are simultaneously refreshed in response to a one-time counting operation of the word line selection addresses WLC_ADDRESS<0:K−1>, the refresh operations are performed at the predetermined time interval (tDELAY). Thus, there is not a great difference in the magnitude of the consumed peak current in comparison to the case where only one word line is refreshed.

Although the bank 200 of FIG. 2 consists of the up mat 202 and the down mat 204, a larger number of mats may be included in the bank 200. Therefore, when assuming that a plurality of mats greater than 2 (i.e., more mats than just the up mat 202 and the down mat 204) are included in the bank 200 of FIG. 2, the semiconductor memory device in accordance with the embodiment of the present invention may be configured as follows.

Figure 4:
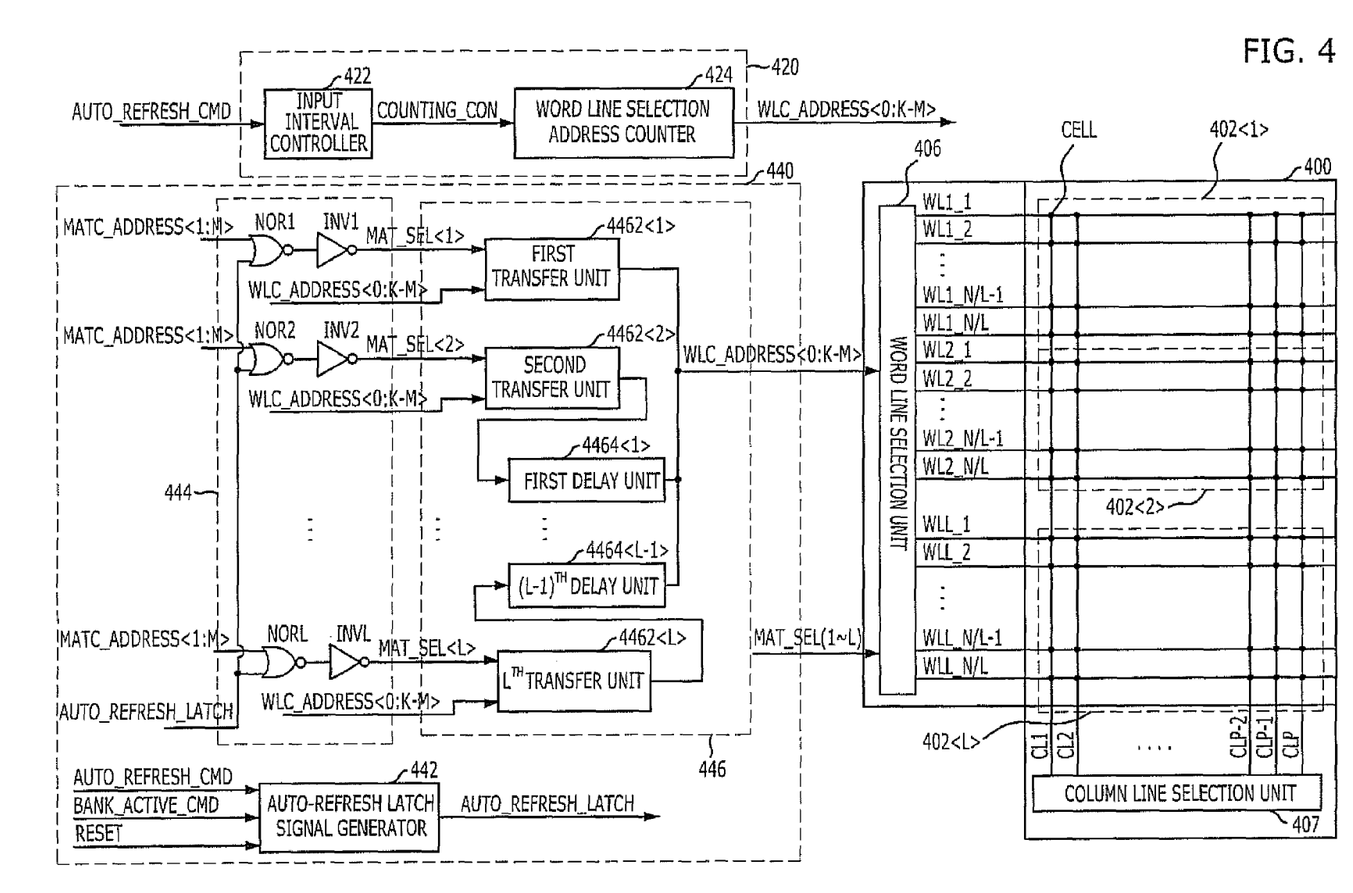
FIG. 4 is a block diagram of an auto-refresh circuit of a semiconductor memory device in accordance with another embodiment of the present invention.

Referring to FIG. 4, the semiconductor memory device includes a bank 400, an address counting unit 420, and an address transferring unit 440. The bank 400 includes a plurality of mats 402<1> to 402<L>. The address counting unit 420 is configured to receive an auto-refresh command AUTO_REFRESH_CMD consecutively applied at intervals corresponding to the number of the mats 402<1> to 402<L>, and sequentially count internal addresses IN_ADDRESS<0:K> in response to the auto-refresh command AUTO_REFRESH_CMD. The address transferring unit 440 is configured to enable the plurality of mats 402<1> to 402<L> in response to the auto-refresh command AUTO_REFRESH_CMD, and transfer word line selection addresses WLC ADDRESS<0:K−M> to the plurality of mats 402<1> to 402<L> sequentially at predetermined intervals (tDELAY).

The internal addresses IN_ADDRESS<0:K> include mat selection addresses MATC_ADDRESS<1:M> for selecting the plurality of mats 402<1> to 402<L>, and word line selection addresses WLC_ADDRESS<0:K-M> corresponding to the plurality of word lines WL1_1, WL1_2, WL1_3 . . . WL1_N/L-2, WL1_N/L-1, WL1_N/L-1 . . . WL2_1, WL2_2, WL2_3 . . . WL2_N/L-2, WL2_N/L-1, WL2_N/L-1 . . . WLL_1, WLL_2, WLL_3 . . . WLL_N/L-2, WLL_N/L-1, and WLL_N/L-1 provided in the plurality of mats 402<1> to 402<L>.

For example, the MSB to $(M-1)^{th}$-bit of the internal addresses IN_ADDRESS<0:K> (i.e., internal addresses IN_ADDRESS<K> to IN_ADDRSS<K-M-1>) may be the mat selection addresses MATC_ADDRESS<1:M>, and the remaining internal addresses IN_ADDRESS<K-M> to IN_ADDRESS<0> (i.e., the internal addresses IN_ADDRESS<0:K> except for the MSB to $(M-1)^{th}$-bit internal addresses IN_ADDRESS<K> to IN_ADDRESS<K-M-1>) may be the word line selection addresses WLC_ADDRESS<0:K-M>.

The address counting unit 420 includes an input interval controller 422 and a word line selection address counter 424. The input interval controller 422 is configured to generate a counting control signal COUNTING_CON in response to the auto-refresh command AUTO_REFRESH_CMD, which is inputted as many times as the number of the mats 402<1> to 402<L> (i.e., 'L' times). The word line selection address counter 424 is configured to count the word line selection addresses WLC_ADDRESS<0:K-M> in response to the counting control signal COUNTING_CON.

Although it might seem incorrect that, as described above, the address counting unit 420 sequentially counts the internal addresses IN_ADDRESS<0:K>, because the word line selection address counter 424 provided in the address counting unit 420 counts the word line selection addresses WLC_ADDRESS<0:K-M>, this is not the case. As described above, since the internal addresses IN_ADDRESS<0:K> include the mat selection addresses MATC_ADDRESS<1:M> and the word line selection addresses WLC_ADDRESS<0:K-M>, counting the internal addresses IN_ADDRESS<0:K> sequentially in the address counting unit 420 may be the same operation as counting the word line selection addresses WLC_ADDRESS<0:K-M>.

In this case, when counting the internal addresses IN_ADDRESS<0:K>, the counting operation is performed $2^K$ times until the counting operation is completed. On the other hand, when counting the word line selection addresses WLC_ADDRESS<0:K-M>, the counting operation is performed $2^{K-M}$ times until the counting operation is completed.

That is, in the semiconductor memory device in accordance with the embodiment of the present invention, the address counting unit 420 counts the internal addresses IN_ADDRESS<0:K> in the same manner as in the conventional semiconductor memory device, but the numbers of the counting operation are reduced by 1/L.

Since the plurality of mats 402<1> to 402<L> exist in the bank 400, the input interval controller 422 and the word line selection address counter 424 provided in the address counting unit 420 may operate as follows.

First, when a count value obtained by counting the input numbers of the auto-refresh command AUTO_REFRESH_CMD becomes L, the input interval controller 422 performs an operation of changing the logic level of the counting control signal COUNTING_CON in response to the count value.

Furthermore, the word line selection address counter 424 performs an operation of sequentially counting the word line selection addresses WLC_ADDRESS<0:K-M> at each logic level transition of the logic level of the counting control signal COUNTING_CON.

The address transferring unit 440 includes an auto-refresh latch signal generator 442, a mat enable controller 444, and a transfer controller 446. The auto-refresh latch signal generator 442 is configured to generate an auto-refresh latch signal AUTO_REFRESH_LATCH which is activated in response to the auto-refresh command AUTO_REFRESH_CMD and deactivated in response to a bank active signal BANK_ACTIVE_CMD. The mat enable controller 444 is configured to activate a plurality of mat selection signals MAT_SEL<1> to MAT_SEL<L>, which are matched with the mat selection addresses MATC_ADDRESS<1:M> and correspond to the plurality of mats 402<1> to 402<L>, while in an activation period of the auto-refresh latch signal AUTO_REFRESH_LATCH. The transfer controller 446 is configured to transfer the word line selection addresses WLC_ADDRESS<0:K-M> to the plurality of mats 402<1> to 402<L> in response to the activated mat selection signals MAT_SEL<1> to MAT_SEL<L> at predetermined time intervals (tDELAY) therebetween.

In the activation period of the auto-refresh latch signal AUTO_REFRESH_LATCH, the mat enable controller 444 is configured to activate the plurality of mat selection signal MAT_SEL<1> to MAT_SEL<L>, without regard to the activation and deactivation of the mat selection addresses MATC_ADDRESS<1:M>. On the other hand, in the deactivation period of the auto-refresh latch signal AUTO_REFRESH_LATCH, the mat enable controller 444 is configured to activate the mat selection signals corresponding to the enabled addresses among the mat selection addresses MATC_ADDRESS<1:M>, and deactivate the mat selection signals corresponding to the disabled addresses among the mat selection addresses MATC_ADDRESS<1:M>.

The configuration of the mat enable controller 444 will be described below in more detail. The mat enable controller 444 includes a plurality of NOR gates NOR1 to NORL and a plurality of inverters INV1 to INVL. The NOR gates NOR1 to NORL are configured to receive the mat selection addresses MATC_ADDRESS<1:M> (M signals are simultaneously received) and the auto-refresh latch signal AUTO_REFRESH_LATCH through first and second input terminals thereof, and determine the logic levels of the plurality of mat selection signals MAT_SEL<1> to MAT_SEL<L>, respectively. Furthermore, the inverters INV1 to INVL are configured to invert the outputs of the NOR gates NOR1 to NORL, respectively.

For example, assuming the mat selection address MATC_ADDRESS<1:M> is a 3-bit signal (i.e., M=3), the operation of generating the plurality of mat selection signals MAT_SEL<1> to MAT_SEL<L> will be described. When the mat selection addresses MATC_ADDRESS<1:M> applied through the first input terminals of the NOR gates NOR1 to NORL are '001', the first mat selection signal MAT_SEL<1> among the plurality of mat selection signals MAT_SEL<1> to MAT_SEL<L> is activated.

Likewise, when the mat selection addresses MATC_ADDRESS<1:M> applied through the first input terminals of the NOR gates NOR1 to NORL are '011', the third mat selection signal MAT_SEL<3> among the plurality of mat selection signals MAT_SEL<1> to MAT_SEL<L> is activated.

When the auto-refresh latch signal AUTO_REFRESH_LATCH is activated, the plurality of mat selection signals MAT_SEL<1> to MAT_SEL<L> are activated, without regard to the values of the mat selection addresses MATC_ADDRESS<1:M> applied through the first input terminals of the NOR gates NOR1 to NORL.

The transfer controller 446 includes a plurality of transfer units 4462<1> to 4462<L> and a plurality of delay units 4464<1> to 4464<L-1>. The transfer units 4462<1> to 4462<L> are configured to receive the selection signals MAT_SEL<1> to MAT_SEL<L> and the word line selection addresses WLC_ADDRESS<0:K-M>, and transfer the word line selection addresses WLC_ADDRESS<0:K-M> to the mats corresponding to the mat selection signals MAT_SEL<1> to MAT_SEL<L>, respectively. The delay units 4464<1> to 4464<L-1> are connected to the output terminals of the transfer units 4462<2> to 4462<L> (i.e., a delay unit 4464 is connected to an output of each of the transfer units 4462 except the first transfer unit 4462<1>), respectively. Further, the delay units 4464<1> to 4464<L-1> are configured to delay the word line selection addresses WLC_ADDRESS<0:K-M> by predetermined times tDELAY, 2xtDELAY ... (L-1)xtDELAY, respectively.

The first transfer unit 4462<1> among the plurality of transfer units 4462<1> to 4462<L> is configured to transfer the word line selection addresses WLC_ADDRESS<0:K-M> to the word line selection unit 406 provided in the bank 400 in response to the activation of the first mat selection signal MAT_SEL<1> among the plurality of mat selection signals MAT_SEL<1> to MAT_SEL<L>. In this case, since the word line selection unit 406 provided in the bank 400 allows the word line selection addresses WLC_ADDRESS<0:K-M> to be provided from the first transfer unit 4462<1> to the first mat 402<1> in response to the activation of the first mat selection signal MAT_SEL<1>, any one of the word lines WL1_1, WL1_2, WL1_3 . . . WL1_N/L-3, WL1_N/L-2, WL1_N/L-1, and WL1_N/L provided in the first mat 402<1> among the plurality of mats 402<1> to 402<L> may be selected in response to the word line selection addresses WLC_ADDRESS<0:K-M>.

The $L^{th}$ transfer unit 4462<L> among the plurality of transfer units 4462<1> to 4462<L> is configured to transfer the word line selection addresses WLC_ADDRESS<0:K-M> to the word line selection unit 406 provided in the bank 400 in response to the activation of the $L^{th}$ mat selection signal MAT_SEL<L> among the plurality of mat selection signals MAT_SEL<1> to MAT_SEL<L>. In this case, since the word line selection unit 406 provided in the bank 400 allows the word line selection addresses WLC_ADDRESS<0:K-M> to be provided from the $L^{th}$ transfer unit 4462<L> to the $L^{th}$ mat 402<L> in response to the activation of the $L^{th}$ mat selection signal MAT_SEL<L>, any one of the word lines WLL_1, WLL_2, WLL_3 . . . WLL_N/L-3, WLL_N/L-2, WLL_N/L-1, and WLL_N/L provided in the $L^{th}$ mat 402<L> among the plurality of mats 402<1> to 402<L> may be selected in response to the word line selection addresses WLC_ADDRESS<0:K-M>.

The delay units 4464<1> to 4464<L-1> are connected to the output terminals of the transfer unit 4462<2> to 4462<L>, respectively, and configured to delay the word line selection addresses WLC_ADDRESS<0:K-M>, which are transferred from the transfer units 4462<2> to 4462<L> to the word line selection unit 406 of the bank 400, by the predetermined times tDELAY, 2xtDELAY, (L-1)xtDELAY, respectively.

For example, the first delay unit 4464<1> among the plurality of delay units 4464<1> to 4464<L-1> is configured to delay the word line selection addresses WLC_ADDRESS<0:K-M>, which are outputted from the second transfer unit 4462<2> by the predetermined time (tDELAY), and transfer the delayed word line selection addresses WLC_ADDRESS<0:K-M> to the word line selection unit 406 provided in the bank 400.

The $(L-1)^{th}$ delay unit 4464<L-1> among the plurality of delay units 4464<1> to 4464<L-1> is configured to delay the word line selection addresses WLC_ADDRESS<0:K-M>, which are outputted from the $L^{th}$ transfer unit 4462<L> by the predetermined time ((L-1)xtDELAY), and transfer the delayed word line selection addresses WLC_ADDRESS<0:K-M> to the word line selection unit 406 provided in the bank 400.

The transfer controller 446 may be modified to operate in an opposite manner to the above-described operation. That is, although it has been described above that the plurality of delay units 4464<1> to 4464<L-1> are connected to the output terminals of the transfer units 4462<2> to 4462<L>, respectively, the delay units 4464<1> to 4464<L-1> may be connected to the output terminals of the transfer units 4462<1> to 4462<L-1> in a reverse order.

Meanwhile, in the semiconductor memory device in accordance with the embodiment of the present invention, N/L word lines WL1_1, WL1_2, WL1_3 . . . WL1_N/L-2, WL1_N/L-1, WL1_N/2 . . . WL2_1, WL2_2, WL2_3 . . . WL2_N/L-2, WL2_N/L-1, WL2_N/L . . . WLL_1, WLL_2, WLL_3 . . . WLL_N/L-2, WLL_N/L-1, and WLL_N/L are provided in the plurality of mats 402<1> to 402<L>, respectively. The refresh operation is simultaneously performed on the mats 402<1> to 402<L> at multiples of the predetermined time interval (tDELAY). Therefore, in order to refresh the total number N of the word lines WL1_1, WL1_2, WL1_3 . . . WL1_N/L-2, WL1_N/L-1, WL1_N/2 . . . WL2_1, WL2_2, WL2_3 . . . WL2_N/L-2, WL2_N/L-1, WL2_N/L . . . WLL_1, WLL_2, WLL_3 . . . WLL_N/L-2, WLL_N/L-1, and WLL_N/L provided in the plurality of mats 402<1> to 402<L>, the counting of the word line selection addresses WLC_ADDRESS<0:K-M> is performed N/L times. That is, in the embodiment of the present invention, the counting of the word line selection addresses WLC_ADDRESS<0:K-M> is performed N/L times in order to refresh the total number N of the word lines WL1_1, WL1_2, WL1_3 . . . WL1_N/L-2, WL1_N/L-1, WL1_N/2 . . . WL2_1, WL2_2, WL2_3 . . . WL2_N/L-2, WL2_N/L-1, WL2_N/L . . . WLL_1, WLL_2, WLL_3 . . . WLL_N/L-2, WLL_N/L-1, and WLL_N/L provided in the bank 400, as opposed to the prior art in which the counting of the internal addresses IN_ADDRESS<0:K> is performed N times in order to select the total number N of the word lines WL_1, WL_2, WL_3 . . . WLN_N-3, WLN-2, WLN-1, and WLN. Hence, the counting numbers necessary to complete the auto-refresh operation in the semiconductor memory device in accordance with the embodiment of the present invention are reduced by 1/L compared with those in the conventional semiconductor memory device.

In the semiconductor memory device in accordance with the embodiment of the present invention, when the auto-refresh operation is performed, it is possible to simultaneously refresh the L word lines one by one in the plurality of mats 402<1> to 402<L> included in the bank 400 according to a one-time operation of counting the word line selection addresses WLC_ADDRESS<0:K-M>. Hence, all of the word lines included in the bank 400 may be refreshed, if the operation of counting the word line selection addresses WLC_ADDRESS<0:K-M> as many times as the value obtained by dividing the total number of the word lines included in the bank 400 by 1/L is performed.

Hence, the current consumption in the address counting unit 420, which counts the word line selection addresses WLC_ADDRESS<0:K-M>, is reduced by 1/L because the numbers of the counting operation are reduced by 1/L. In addition, since the circuit operation time is reduced by 1/L, it is possible to reduce the current consumption in the word line selection unit 406, which selects any one of the word lines WL1_1, WL1_2, WL1_3 . . . WL1_N/L-2, WL1_N/L-1, WL2_2, WL2_3 . . . WL2_N/L-2, WL2_N/L-1, WL2_N/L . . . WLL_1, WLL_2, WLL_3 . . . WLL_N/L-2, WLL_N/L-1, and WLL_N/L provided in the bank 400 in response to the word line selection addresses WLC_ADDRESS<0:K−M>.

Moreover, when one word line from each of the plurality of mats 402<1> to 402<L> included in the bank 400, are simultaneously refreshed in response to a one-time counting operation of the word line selection addresses WLC_ADDRESS<0:K−M>, the refresh operations are performed at multiples of the predetermined time interval (tDELAY). Thus, there is not a great difference in the magnitude of the consumed peak current in comparison to the case where only one word line is refreshed.

In accordance with the exemplary embodiments of the present invention, since the word lines are simultaneously refreshed in response to the one-time operation of counting the internal addresses, all of the word lines may be refreshed in such a state that the counting numbers of the internal addresses are less than the number of the word lines included in the bank. Thus, the magnitude of the electric current consumed in the auto-refresh operation may be minimized.

While the present invention has been described with respect to the specific embodiments, it will be apparent to those skilled in the art that various changes and modifications may be made without departing from the spirit and scope of the invention as defined in the following claims.

For example, the positions and types of the logic gates described herein may be changed according to polarities of the input signals.

What is claimed is:

1. A semiconductor memory device, comprising:
a bank comprising a plurality of mats;
an address counting unit configured to receive an auto-refresh command consecutively applied at predetermined intervals corresponding to a number of the mats, and sequentially count an internal address in response to the auto-refresh command; and
an address transferring unit configured to enable the plurality of mats in response to the auto-refresh command, and transfer the internal address to the plurality of mats at predetermined time intervals.

2. The semiconductor memory device of claim 1, wherein the internal address comprises:
a mat selection address for selecting the plurality of mats; and
a word line selection address for selecting a plurality of word lines provided in the plurality of mats.

3. The semiconductor memory device of claim 2, wherein the address counting unit comprises:
an input interval controller configured to generate a counting control signal in response to input numbers of the auto-refresh command; and
a word line selection address counter configured to count the word line selection address in response to the counting control signal.

4. The semiconductor memory device of claim 3, wherein the input interval controller is configured to change a logic level of the counting control signal in response to a count value, which is obtained by counting the input numbers of the auto-refresh command, when the count value is equal to the number of the mats.

5. The semiconductor memory device of claim 4, wherein the word line selection address counter is configured to sequentially count the word line selection address at each logic level transition of the counting control signal.

6. The semiconductor memory device of claim 3, wherein the address transferring unit comprises:
an auto-refresh latch signal generator configured to generate an auto-refresh latch signal which is activated in response to the auto-refresh command and deactivated in response to a bank active signal;
a mat enable controller configured to activate a plurality of mat selection signals in an activation period of the auto-refresh latch signal, the plurality of mat selection signals being matched with the mat selection address and corresponding to the plurality of mats; and
a transferring controller configured to transfer the word line selection address to the plurality of mats corresponding to the plurality of mat selection signals in an activation period at predetermined time intervals.

7. The semiconductor memory device of claim 6, wherein a refresh operation is performed by driving word lines corresponding to the word line selection address among the plurality of word lines, which are provided in a corresponding mat, at a point in time when the word line selection address is transferred through the transferring controller to the corresponding mat.

8. The semiconductor memory device of claim 6, wherein the mat enable controller is configured to activate the plurality of mat selection signals, without regard to activation and deactivation states of the mat selection address, when the auto-refresh latch signal is in an activated state.

9. The semiconductor memory device of claim 8, wherein the mat enable controller is configured to activate the mat selection signal matched to the mat selection address in an activated state, and deactivate the mat selection signal matched to the mat selection address in a deactivated state.

10. A semiconductor memory device, comprising:
a bank comprising an up mat and a down mat;
an address counting unit configured to receive an even or odd command of an auto-refresh command consecutively applied, and sequentially count an internal address in response to the even or odd command; and
an address transferring unit configured to enable the up mat and the down mat in response to the auto-refresh command, and transfer the internal address to the up mat and the down mat at predetermined time intervals.

11. The semiconductor memory device of claim 10, wherein the internal address comprises:
a mat selection address for selecting the up mat and the down mat; and
a word line selection address for selecting a plurality of word lines provided in the up mat and the down mat.

12. The semiconductor memory device of claim 11, wherein the address counting unit comprises:
an input interval controller configured to generate a counting control signal in response to the even or odd command of the auto-refresh command; and
a word line selection address counter configured to count the word line selection address in response to the counting control signal.

13. The semiconductor memory device of claim 12, wherein the input interval controller is configured to change a logic level of the counting control signal in response to the auto-refresh command.

14. The semiconductor memory device of claim 13, wherein the word line selection address counter is configured to sequentially count the word line selection address at each rising edge of the counting control signal, or sequentially count the word line selection address at each falling edge of the counting control signal.

15. The semiconductor memory device of claim 12, wherein the input interval controller is configured to change a logic level of the counting control signal in response to a count value, which is obtained by counting input numbers of the auto-refresh command, when the count value becomes 2.

16. The semiconductor memory device of claim 15, wherein the word line selection address counter is configured to sequentially count the word line selection address at each logic level transition of the counting control signal.

17. The semiconductor memory device of claim 12, wherein the address transferring unit comprises:
an auto-refresh latch signal generator configured to generate an auto-refresh latch signal which is activated in response to the auto-refresh command and deactivated in response to a bank active signal;
a mat enable controller configured to activate an up mat selection signal, which is matched with an activated state of the mat selection address, and a down mat selection signal, which is matched with a deactivated state of the mat selection address, when the auto-refresh latch signal is in an activated state; and
a transferring controller configured to transfer the word line selection address to the up mat in response to an activation state of the up mat selection signal, and transfer the word line selection address to the down mat in response to an activation state of the down mat selection signal at predetermined time intervals.

18. The semiconductor memory device of claim 17, wherein a refresh operation is performed on the up mat by driving any one of the plurality of word lines corresponding to the word line selection address provided in the up mat, at a first point in time when the word line selection address is inputted to the up mat; and
a refresh operation is performed on the down mat by driving any one of the plurality of word lines corresponding to the word line selection address provided in the down mat, at a second point in time when the word line selection address is inputted to the down mat, the second point in time being later than the first point in time by a predetermined time and the refresh operation of the up mat being incomplete.

19. The semiconductor memory device of claim 17, wherein a refresh operation is performed on the down mat by driving any one of the plurality of word lines corresponding to the word line selection address provided in the down mat, at a first point in time when the word line selection address is inputted to the down mat; and
a refresh operation is performed on the up mat by driving any one of the plurality of word lines corresponding to the word line selection address provided in the up mat, at a second point in time when the word line selection address is inputted to the up mat, the second point in time being later than the first point in time by a predetermined time and the refresh operation of the down mat being incomplete.

20. The semiconductor memory device of claim 17, wherein the mat enable controller is configured to activate the up mat selection signal and the down mat selection signal, without regard to activation and deactivation states of the mat selection address, when the auto-refresh latch signal is in an activated state.

21. The semiconductor memory device of claim 20, wherein, in a deactivation period of the auto-refresh latch signal, the mat enable controller is configured to activate the up mat selection signal and deactivate the down mat selection signal when the mat selection address is in an activated state, and the mat enable controller is configured to deactivate the up mat selection signal and deactivate the down mat selection signal when the mat selection address is in a deactivated state.

* * * * *